(12) United States Patent
Jasper et al.

(10) Patent No.: US 11,694,885 B2
(45) Date of Patent: Jul. 4, 2023

(54) PULSE SHAPING CIRCUIT

(71) Applicant: Thermo Fisher Scientific (Bremen) GmbH, Bremen (DE)

(72) Inventors: Eike Jasper, Stuhr (DE); Ralf Seeba, Bremen (DE); Mariugenia Salas-Hellwinkel, Bremen (DE)

(73) Assignee: Thermo Fisher Scientific (Bremen) GMBH, Bremen (DE)

( * ) Notice: Subject to any disclaimer, the term of this patent is extended or adjusted under 35 U.S.C. 154(b) by 0 days.

(21) Appl. No.: 17/483,410

(22) Filed: Sep. 23, 2021

(65) Prior Publication Data
US 2022/0115221 A1 Apr. 14, 2022

(30) Foreign Application Priority Data
Oct. 8, 2020 (GB) ........................ 2015968

(51) Int. Cl.
*H01J 49/02* (2006.01)
*G01N 30/62* (2006.01)

(52) U.S. Cl.
CPC ............ *H01J 49/025* (2013.01); *G01N 30/62* (2013.01); *H01J 49/022* (2013.01)

(58) Field of Classification Search
CPC ...... H01J 49/025; H01J 49/022; G01N 30/62; H03K 5/04; H03K 5/1252; H03K 2005/00293
USPC .................................................. 250/281
See application file for complete search history.

(56) References Cited

U.S. PATENT DOCUMENTS 2,778,949 A * 1/1957 Borkowski ............ H03K 21/00
250/369
3,518,414 A * 6/1970 Goodman ............... G06F 17/18
708/445

FOREIGN PATENT DOCUMENTS

FR 2462821 A1 2/1981
JP S6076807 A 5/1985
JP H1165894 A 3/1999
WO 2004051850 A2 6/2004

OTHER PUBLICATIONS

Combined Search and Examination Report dated Mar. 29, 2021, to GB Patent Application No. 2015968.7.

* cited by examiner

*Primary Examiner* — Kiet T Nguyen
(74) *Attorney, Agent, or Firm* — Thomas F. Cooney

(57) ABSTRACT

A pulse shaping circuit for a spectrometer comprises a circuit input terminal for receiving detector pulses from an analog ion detector, a flip-flop for receiving detector pulses from the circuit input terminal, a delay unit for receiving output pulses from the flip-flop and feeding delayed output pulses to a reset input terminal of said flip-flop, and a circuit output terminal for supplying the output pulses or the delayed output pulses to a counter. The duration of the output pulses and the minimum duration of the interval between the output pulses is determined by the delay unit. The pulse shaping circuit may comprise at least one Schmitt trigger.

20 Claims, 12 Drawing Sheets

PULSE SHAPING CIRCUIT

CROSS REFERENCE TO RELATED APPLICATION

This application claims, under 35 U.S.C. 119(a), the right of priority to United Kingdom patent application No. GB2015968.7, which was filed on Oct. 8, 2020, the disclosure of which is incorporated herein by reference in its entirety.

FIELD OF THE INVENTION

The present invention relates to a pulse shaping circuit. More in particular, the present invention relates to a pulse shaping circuit for mass spectrometers having detectors such as electron detectors and/or ion detectors. The present invention further relates to a detector pulse processing unit comprising a pulse shaping circuit, as well as to a spectrometer, such as a mass spectrometer, comprising a pulse shaping circuit.

BACKGROUND

In mass spectrometry various detectors are known to detect ions. The detected ions have typically been filtered and/or separated in accordance with their mass-to-charge (m/z) ratio. In typical multipole mass spectrometers, the multipole (typically, but not necessarily a quadrupole) may scan through a range of m/z values, acting as a filter. For each m/z value (or sub-range of m/z values), the quantity of ions is determined. The quantities of ions having different m/z values are therefore separated in time and determined sequentially. An example of a multipole mass spectrometer is disclosed in U.S. Pat. No. 9,934,954 (Thermo Fisher Scientific), which is herewith incorporated by reference in this document.

Sector field mass spectrometers are capable of separating ions in space by applying, for example, a magnetic field which causes ions to follow curved trajectories, the radiuses of which depend on their m/z values. The quantities of ions having different m/z values can therefore be determined simultaneously. An example of a sector field mass spectrometer comprising an ion multicollector is disclosed in United States patent application US 2018/0308674 (Thermo Fisher Scientific & University of Bristol), which is herewith incorporated by reference in this document.

Such mass spectrometers typically comprise an ion source for generating a beam of ions from a sample, a mass filter downstream of the ion source to select ions from the beam by their mass-to-charge ratio (m/z), a collision cell downstream of the mass filter to remove interfering ions, a mass filter downstream of the collision cell and a detector unit downstream of the mass filter. The detector unit may comprise a plurality of ion detectors for detecting a plurality of different ion species in parallel and/or simultaneously.

Several types of ion detectors are known, for example Faraday cups, compact discrete dynodes (CDDs) and secondary electron multipliers (SEDs). In some mass spectrometers, a plurality of Faraday cups is combined with one or two other types of ion detectors, the Faraday cups being used for ions occurring in larger quantities and the other type(s) of ion detector being used for ions occurring in smaller quantities.

The ions impinging on a Faraday cup can cause a small current to flow through a resistor which typically has a high resistance. The resulting voltage across the resistor is typically converted using a voltage-to-frequency converter (VFC) into a frequency which represents the voltage and hence represents the number of ions. Accordingly, each Faraday cup produces, through its associated VFC, an output signal consisting of pulses, the number of pulses per second representing the quantity of ions impinging on the particular Faraday cup.

Other types of ion detectors may also produce pulses which require counting to determine the number of ions impinging upon the detector within a certain time period. Compact discrete dynodes (CDDs) and secondary electron multipliers (SEDs), for example, produce pulses representing ion avalanches, the number or the frequency of those pulses representing the quantity of ions.

In order to count the number of pulses produced by, for example, a secondary ion multiplier, it is necessary to be able to clearly distinguish subsequent pulses, and to avoid counting artifacts, such as so-called reflection pulses. Thus, to be able to count detector pulses reliably, the actual pulses should have a minimum height and duration, while artifacts should be suppressed.

SUMMARY OF THE INVENTION

The invention aims to provide an electronic circuit that is capable of receiving detector pulses from an analog detector and supplying shaped pulses to a counter, which is reliable, simple, economical, yet effective.

Accordingly, the present invention provides a pulse shaping circuit for a spectrometer, the circuit comprising:
- a circuit input terminal for receiving detector pulses from an analog ion detector,
- a flip-flop for receiving detector pulses from the circuit input terminal,
- a delay unit for receiving output pulses from the flip-flop and feeding delayed output pulses to a reset input terminal of said flip-flop, such that the duration of the output pulses and the minimum duration of the interval between the output pulses is determined by the delay unit, and
- a circuit output terminal for supplying the output pulses or the delayed output pulses to a counter.

By using a flip-flop and a delay unit, it is possible to provide an economical yet reliable pulse shaping circuit which has a small number of parts. The flip-flop receives detector pulses and outputs pulses that can be fed to a counter. An inventive feature of the pulse shaping circuit is the delay unit which is arranged to delay an output pulse of the flip-flop and feed it to a reset input terminal of the flip-flop. Thus, each output pulse produced by the flip-flop causes the flip-flop to be reset after a certain time delay, the amount of time delay being determined by the delay unit. It will be understood that a reset of the flip-flop will cause the output pulse of the flip-flop to end, that is, the reset of the flip-flop can bring the output level of the flip-flop from logical high to logical low. Accordingly, the duration of the output pulse of the flip-flop is determined by the delay unit.

Resetting the flip-flop and thus bringing the output level of the flip-flop from high (logical 1) to low (logical 0) will cause the input level to the reset input terminal to reach low after a certain time delay, the amount of time delay being determined by the delay unit. Typically, the time delay between the output level of the flip-flop becoming high and the input level at the reset input terminal becoming high is substantially identical to the time delay between the output level of the flip-flop becoming low and the input level at the reset input terminal becoming low, although this may not be the case in all embodiments.

By delaying the resetting of the flip-flop and subsequently delaying its setting, the output pulses of the flip-flop are shaped. That is, the output pulses have both a duration and a minimum interval between them, both the duration and the minimum interval being determined by the delay unit and the output pulses are thus shaped by the pulse shaping circuit of the invention.

The above discussion is provided assuming positive logic; those skilled in the art will readily be able to make any necessary adjustments when negative logic is used.

In the pulse shaping circuit of the invention, an output terminal of the delay unit may be coupled to the reset input terminal of the flip-flop via a component having two defined output states. By using a component having two defined output states, it is ensured that the reset input terminal receives a stable voltage, so that the reset of the flip-flop is not terminated at an undesired point in time.

The component having two defined output states, such as a digital component, may comprise a comparator, a component which compares two voltages (or currents) and outputs a digital signal indicating which is larger. It is preferred that the component having two defined output states comprises a Schmitt trigger.

The pulse shaping circuit input terminal may be coupled to the flip-flop via a component having two defined output states. That is, a component having two defined output states, such as a digital component, may be arranged between the input terminal of the pulse shaping circuit and the flip-flop, thus connecting the flip-flop indirectly to the input terminal pf the pulse shaping circuit. This has the advantage that the input terminal of the flip-flop can receive a better defined input voltage.

An output of the flip-flop may be coupled to the circuit output terminal via a component having two defined output states. Although this also aids in better shaping the pulses output by the pulse shaping circuit, the primary purpose of this additional component is to act as a buffer between the flip-flop and any components beyond the circuit output terminal.

In an embodiment, an output of the delay unit can be coupled to the circuit output terminal via a component having two defined output states. In particular the output voltage of the delay unit may not exhibit a pulse having straight edges when a capacitor is used in the delay unit. In that case, a component having two defined output states, such as a digital component, can produce better defined pulse edges.

The component having two defined output states may comprises a digital component, such as an OR gate or a series arrangement of NOT gates, for example. In an embodiment, the component having two defined output states may comprises a comparator. Although a regular comparator may be used, it is preferred to use a Schmitt trigger, as such components effectively reduce noise by suppressing small signal fluctuations.

In an embodiment of the pulse shaping circuit, the delay unit comprises a resistor and a capacitor. By using a resistor and a capacitor, a very simple and economic yet effective delay unit can be achieved. Preferably, the delay unit comprises a series arrangement of a resistor and a capacitor. In some embodiments, the delay unit consists only of a series arrangement of a resistor and a capacitor, one terminal of the capacitor preferably being connected to ground.

In the pulse shaping circuit of the invention, the flip-flop may comprise a D-flip-flop, in which case the reset input terminal of the flip-flop is a clear terminal. As is well known, D flip-flops typically have an input terminal labeled D, an output terminal labeled Q, a reset input terminal labeled Clear or R (reset) as well as a clock input terminal.

In an embodiment, the flip-flop is a D flip-flop, a D input terminal of the flip-flop being connected to a logical "1" level. D flip-flops are widely available and have advantageous properties. When the flip-flop is constituted by a D flip-flop, a clock input terminal of the flip-flop may be connected to the pulse shaping circuit input terminal.

Other types of flip-flops may be used instead. In an embodiment, the flip-flop of the pulse shaping circuit is an SR-flip-flop and the reset input terminal of the flip-flop is an R terminal. As is well known, SR flip-flops have a set (S) input terminal and a reset (R) input terminal.

In an embodiment in which the flip-flop is an SR flip-flop, the pulse shaping circuit may further comprise an AND-gate arranged between the circuit input terminal and the flip-flop, the AND-gate being arranged to receive inverted delayed output pulses of the flip-flop. The pulse shaping circuit comprising an AND-gate may further comprise an inverter arranged between the delay unit and the AND-gate. This allows detector pulses to be selectively fed to the SR flip-flop, that is, a (positive or high) input pulse may only be supplied to the S input terminal of the flip-flop if the voltage at the R input terminal is low, thus avoiding any undefined state of the flip-flop.

The invention further provides a detector pulse processing unit, comprising a pulse shaping circuit as described above. In an embodiment, the detector pulse processing unit may comprise:
  an optional amplifier for amplifying analog detector pulses,
  a pulse shaping circuit as described above for shaping detector pulses which may or not be amplified, and
  a counter for counting shaped detector pulses.

The invention additionally provides a spectrometer, such as a mass spectrometer, comprising a detector pulse processing unit as described above. The spectrometer may be an inductively coupled plasma (ICP) mass spectrometer. The spectrometer comprising a detector pulse processing unit as described above may further comprise at least one of an ion source, a beam focusing unit, a magnetic sector unit, a multipole unit, a detector unit, and a detector signal processing unit, wherein the detector pulse processing unit may be part of the detector signal processing unit.

DETAILED DESCRIPTION OF THE DRAWINGS

The invention provides a pulse shaping circuit designed to suppress spurious pulses produced by a detector, such as an electron detector or an ion detector. The pulse shaping circuit of the invention is further designed to produce pulses having a minimum pulse length to facilitate counting the pulses. The pulse shaping circuit will be described with reference to a spectrometer, such as a mass spectrometer, an electron spectrometer or an optical spectrometer.

Figure 1:
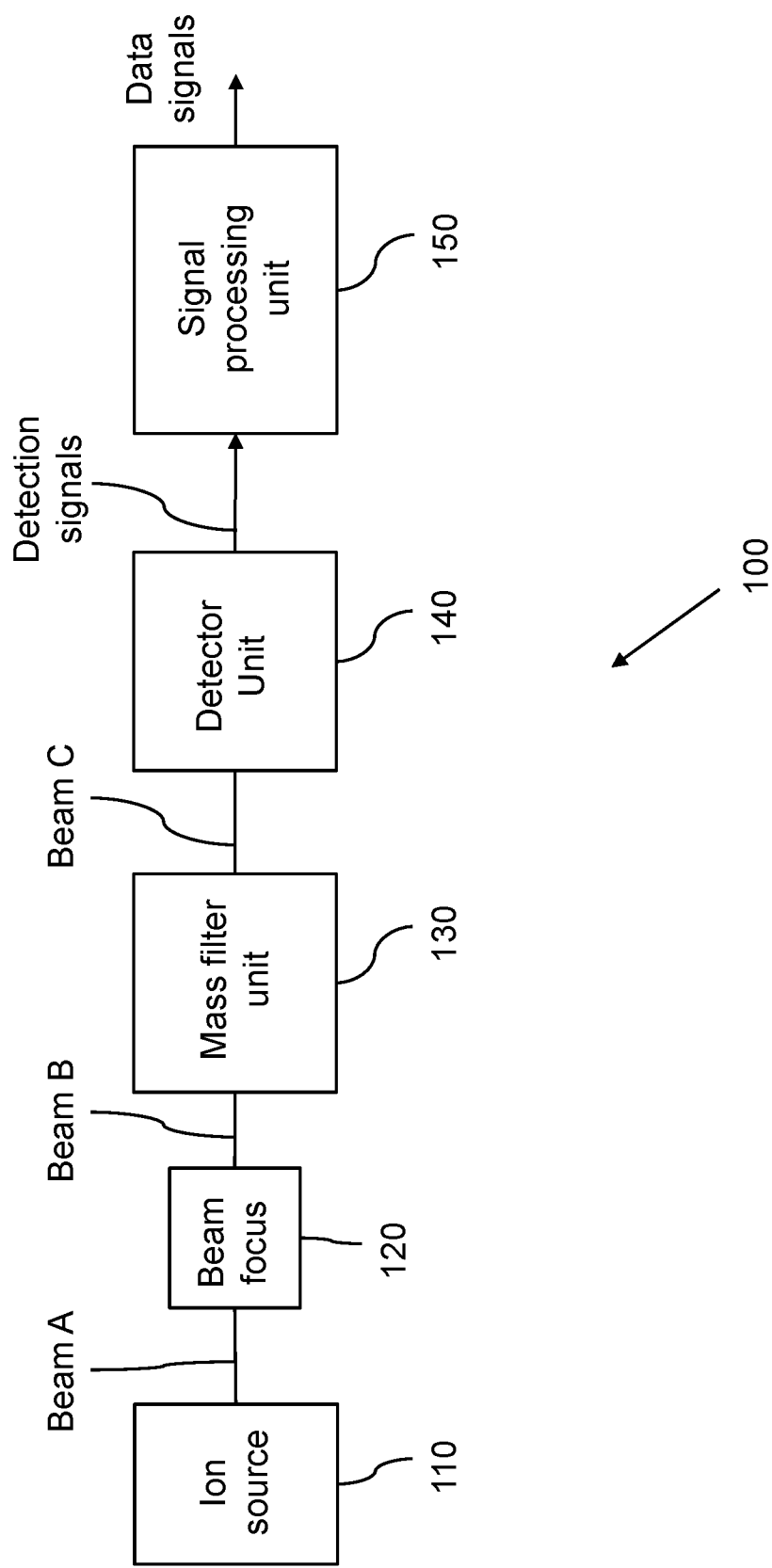
FIG. 1 schematically shows an exemplary embodiment of a mass spectrometer in which the invention may be applied.

A mass spectrometer in which the invention may be applied is, by way of example, schematically illustrated in FIG. 1. The mass spectrometer 100 is shown to comprise an ion source 110, a beam focusing unit 120, a mass filter unit 130, a detector unit 140, and a signal processing unit 150. The ion source 110 may be a plasma source, such as an inductively coupled plasma (ICP) source. The ion source 110 is arranged for producing an original ion beam A which is focused by the beam focusing unit 120 to become a focused ion beam B. The beam focusing unit 120 can comprise suitable ion optics which may be known per se. A collision/reaction cell may optionally be arranged between the beam focusing unit 120 and the mass filter unit 130, and/or between the mass filter unit 130 and the detector unit 140.

In the mass filter unit 130, ions contained in the ion beam B may be separated according to their respective masses. If the mass filter unit 130 comprises a magnetic sector unit, the single focused ion beam B entering the mass filter unit 130 is split up into multiple ions beams C which may reach different detectors of the detector unit 140, allowing ions having different masses to be detected separately. If the mass filter unit 130 comprises a multipole unit, such as a quadrupole unit or a hexapole unit, in a certain time period ions of only a selected range of mass/charge (m/z) values will leave the mass filter unit 130 as beam C and will reach the detector unit 140. In response to detecting ions, the detector unit 140 produces ion detection signals which can be amplified and further processed in the signal processing unit 150, resulting in data signals which may include an average detection frequency per ion detector, and hence per ion mass range.

Figure 2:
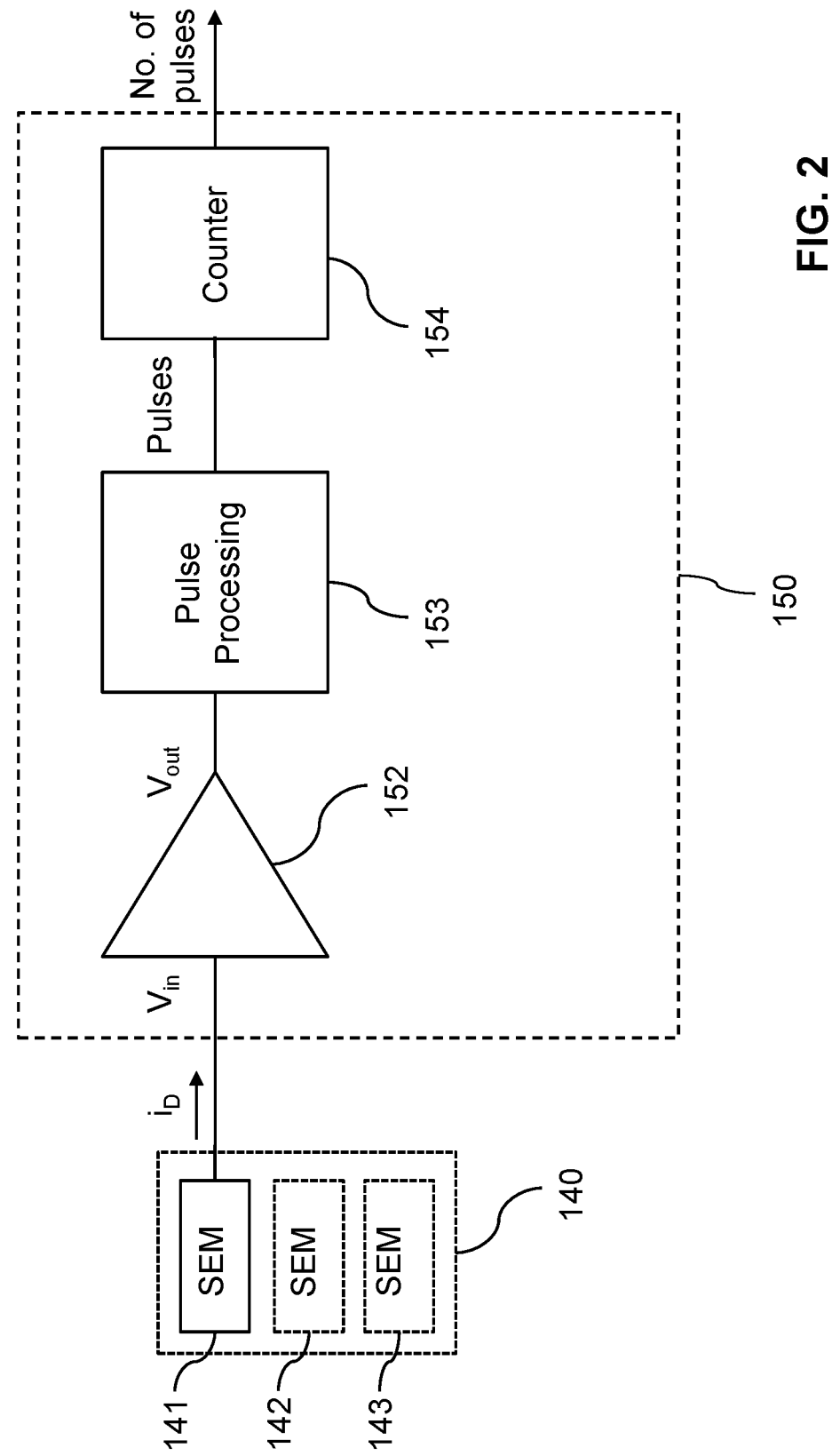
FIG. 2 schematically shows the signal processing unit of the mass spectrometer of FIG. 1 in more detail.

Part of the mass spectrometer 100 of FIG. 1 is shown in more detail in FIG. 2. In particular, FIG. 2 schematically shows part of the detector unit 140 and part of the signal processing unit 150.

The detector unit 140 is shown to comprise secondary electron multipliers (SEMs) 141, 142 and 143. The detector unit 140 may comprise more than three (or less than three) secondary electron multipliers (SEMs), as well as additional ion detectors, such as Faraday cups and/or compact discrete dynodes (CDDs).

As is well known, secondary electron multipliers (SEMs) and similar ion detectors produce pulses having small voltages which are proportional to the number of impinging ions. These small voltages, typically in a range from 1 mV to 10 mV, are converted into a voltage in a range from 1 to 10 V. To this end, the signal processing unit 150 comprises an analogue amplifier 152. It is noted that the amplifier 152 is drawn here only schematically, and that the amplifier 152 may comprise an operational amplifier with a negative feedback loop and other components. It is further noted that only a single amplifier 152 is shown here for the sake of simplicity of the drawing, but it will be understood that each detector 141-143 of the detector unit 140 may be connected to an individual amplifier 152. In some embodiments, two or more detectors may share an input resistor and an amplifier.

The amplifier 152 produces pulses having an output voltage $V_{out}$ which may be significantly larger than the input voltage $V_{in}$, for example 10, 100 or 1000 times greater. The pulses having this output voltage $V_{out}$ are then fed to a pulse processing unit 153, which processes the received pulses to produce pulses P with a suitable shape and duration for counting by the counter 154.

To determine an average frequency, the pulse processing circuit may count the number of pulses during a time period, determine the duration of that time period, and divide the number of pulses by the duration.

As mentioned above, the pulse processing unit 153 comprises a circuit for shaping pulses, in particular for eliminating spurious peaks between the pulses, and for providing a minimum pulse duration to allow a reliable counting of the pulses.

Figure 3:
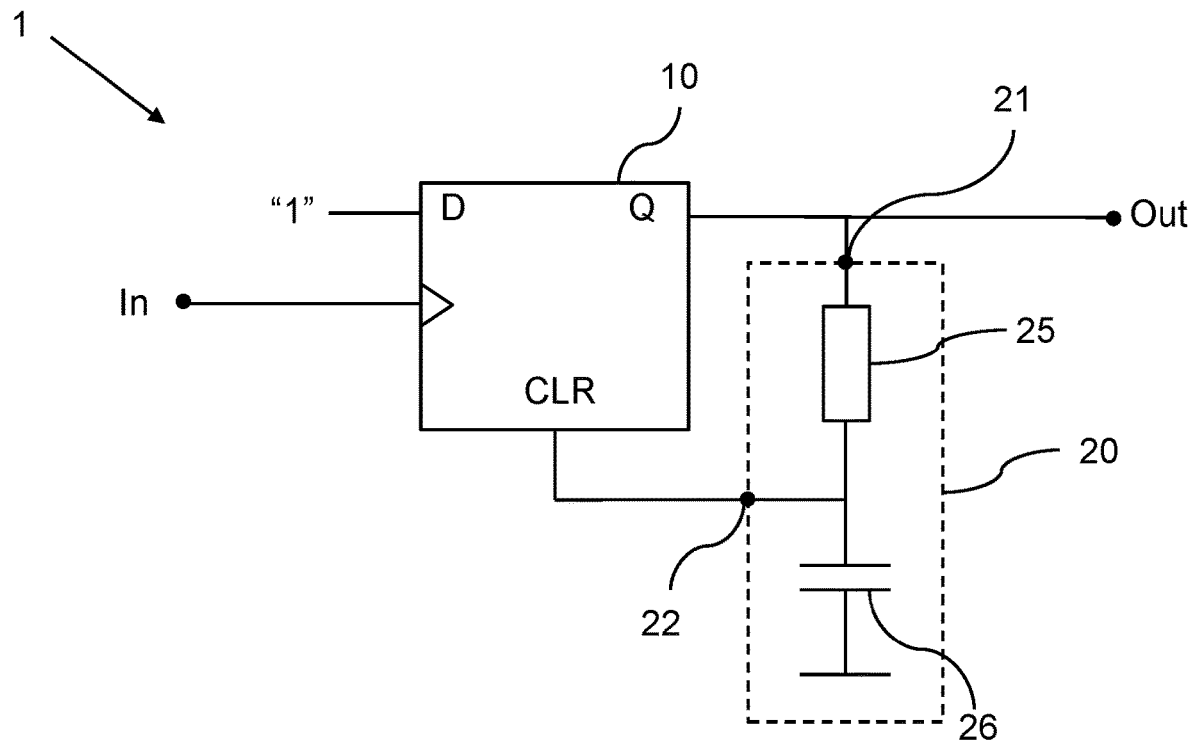
FIG. 3 schematically shows a first embodiment of a pulse shaping circuit according to the invention.

An exemplary embodiment of a pulse shaping circuit according to the invention is schematically illustrated in FIG. 3. The pulse shaping circuit 1, which may be part of the pulse processing unit 153 of FIG. 2, is shown to comprise a flip-flop 10 and a delay unit 20. The pulse shaping circuit 1 is shown to further comprise a pulse shaping circuit input In and a pulse shaping circuit output Out. The delay unit 20 is shown to comprise a delay unit input 21 and a delay unit output 22.

In the example shown, the delay unit 20 comprises a series arrangement of a resistor 25 and a capacitor 26. A first terminal of the resistor 25 is connected to the delay unit input terminal 21 while a second terminal of the resistor 25 is connected to both a first terminal of the capacitor 26 and the delay unit output terminal 22. The second terminal of the capacitor 26 is, in the example shown, connected to ground. This embodiment of the delay unit 20 is simple and economical, yet effective. It will be understood that other embodiments of the delay unit can be used, for example other arrangements of, for example, one or more resistors and one or more capacitors, and/or arrangements including one of more digital elements, such as delay lines, gates and/or flip-flops.

In the embodiment of FIG. 3, the flip-flop 10 is a D flip-flop having a D input terminal and a Q output terminal (a D flip-flop may also have an inverted Q output terminal but such a terminal is not used in this embodiment). The D input terminal of the flip-flop 10 is connected to a voltage representing a logical "1" level, typically a relatively high voltage level such as the positive supply voltage. As a result, a logical "1" is always present at the D input terminal and will be copied to the Q output terminal at each pulse at the clock input terminal (represented with a triangle in FIG. 3).

The clock input terminal of the flip-flop 10 is connected to the circuit input In. As a result, the state of the flip-flop can change at each received detector pulse. As explained above with reference to FIG. 2, such a detector pulse can be generated by a detector, such as a SEM detector 141 in response to detecting ions, and can be amplified by an amplifier, such as the amplifier 152. Thus, each detector pulse causes the logical "1" of the D input terminal to appear at the Q output terminal. As the Q output terminal of the flip-flop 10 is connected to the circuit output Out, this circuit output Out is at the (relatively) high voltage representing the logical "1".

The Q output terminal of the flip-flop 10 is also connected to the delay unit input terminal 21, while the delay unit output terminal 22 is connected to a clear input terminal CLR (it is noted that some D flip-flops may alternatively, or additionally, have an inverted clear input terminal; if such a clear input terminal is used, an inverter may be arranged between the delay unit output terminal 22 and the clear input terminal). The delay unit 20 can be arranged in such a way that a high voltage appearing at its input terminal 21 will, after a predetermined delay, appear at its output terminal 22. Alternatively, or additionally, the delay unit 20 can be arranged in such a way that a low voltage appearing at its input terminal 21 will, after a predetermined delay, appear at its output terminal 22.

In the embodiment shown, a relatively high voltage (such as the positive supply voltage) applied to the resistor 25 will cause the capacitor 26 to be charged. After a certain delay, determined by the resistance of the resistor 25 and the capacitance of the capacitor 26, the output terminal 22 of the delay unit 20, and hence the clear input terminal CLR of the flip-flop, will also be at this high voltage. As a result, the flip-flop will be cleared (that is, reset) and the output terminal Q of the flip-flop 10 will assume a low voltage (for example ground), representing a logical "0". The pulse shaping circuit output Out will then also assume a low voltage.

When the output terminal Q of the flip-flop 10 assumes a low voltage, the input terminal 21 of the delay unit 20 will, in the embodiment shown in FIG. 3, also assume a low voltage. As a result, the capacitor 26 will start to discharge via the resistor 25 and consequently the voltage at the delay unit output terminal 22, and thus at the clear input terminal CLR of the flip-flop 10, will start to drop. Eventually, the voltage will have dropped enough for the clear input terminal CLR to assume a logical "0" level, thus ending the clearing of the flip-flop and allowing the flip-flop to resume copying the logical "1" at the D input terminal to the Q output terminal at the next pulse received at the clock input terminal.

It can thus be seen that a detector pulse fed to the clock input terminal of the flip-flop will result in a high voltage, and hence a pulse, at the output of the flip-flop and of the pulse shaping circuit 1. This pulse will have a duration determined by the delay unit 20, as after a predetermined delay the flip-flop will be reset, resulting in a low voltage and hence the absence of a pulse at the output of the flip-flop and of the pulse shaping circuit 1. This absence of a pulse, or pulse interval, has a duration which is also determined by the delay unit 20. It is noted that no pulse can appear at the pulse shaping circuit output terminal Out during this pulse interval, as the flip-flop 10 is in the clear state. Thus, short spurious pulses will be filtered by the pulse shaping circuit 1 and not be transmitted. Conversely, pulses that are transmitted have a minimum duration determined by the delay unit 20, which allows these pulses to be counted reliably by a counter (such as the counter 154 in FIG. 2, for example).

It is noted that in the embodiment shown in FIG. 3, the duration of the pulses will be approximately equal to the duration of the pulse interval, but these durations may not necessarily be equal in other embodiments.

Figure 4:
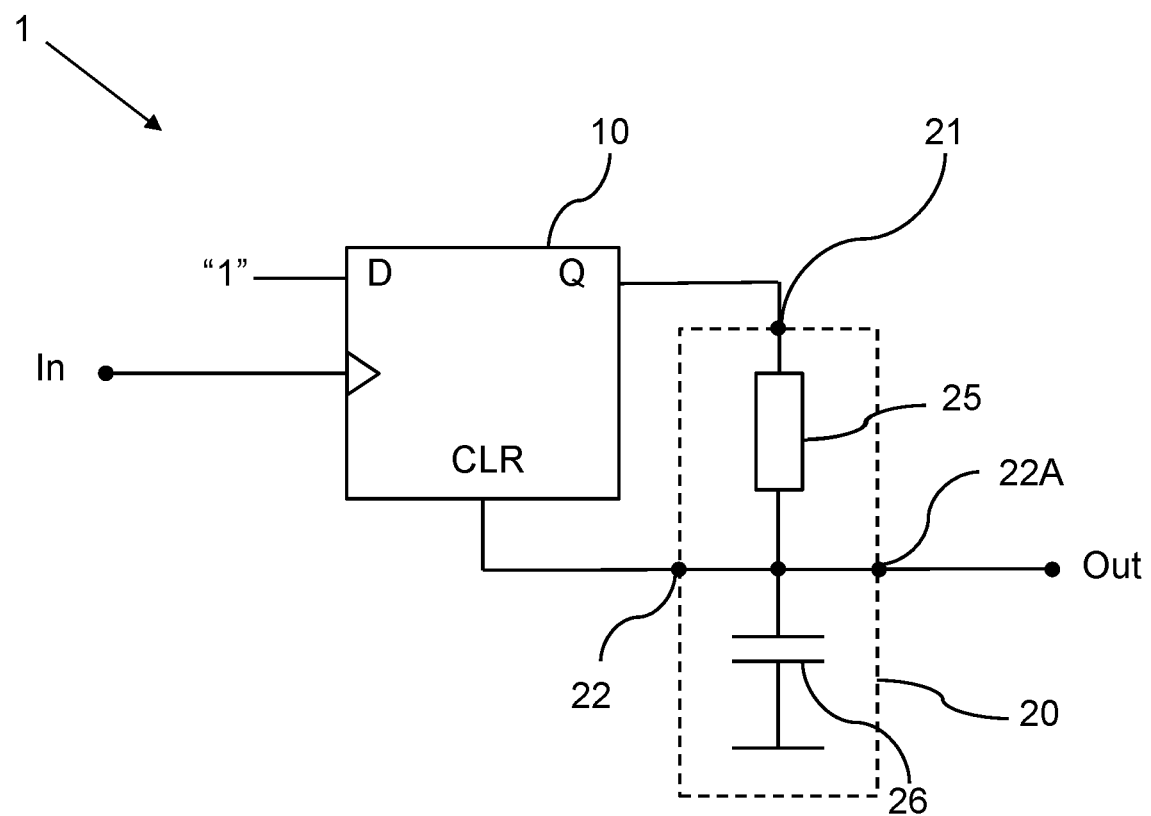
FIG. 4 schematically shows a second embodiment of a pulse shaping circuit according to the invention.

In the embodiment of FIG. 3, the pulse shaping circuit output terminal Out is directly connected to the Q output terminal of the flip-flop 10. In the embodiment of FIG. 4, the pulse shaping circuit output terminal Out is connected to the delay unit output terminal 22. As a result, the pulses that can be output by this embodiment will be delayed by the delay unit.

Figure 5:
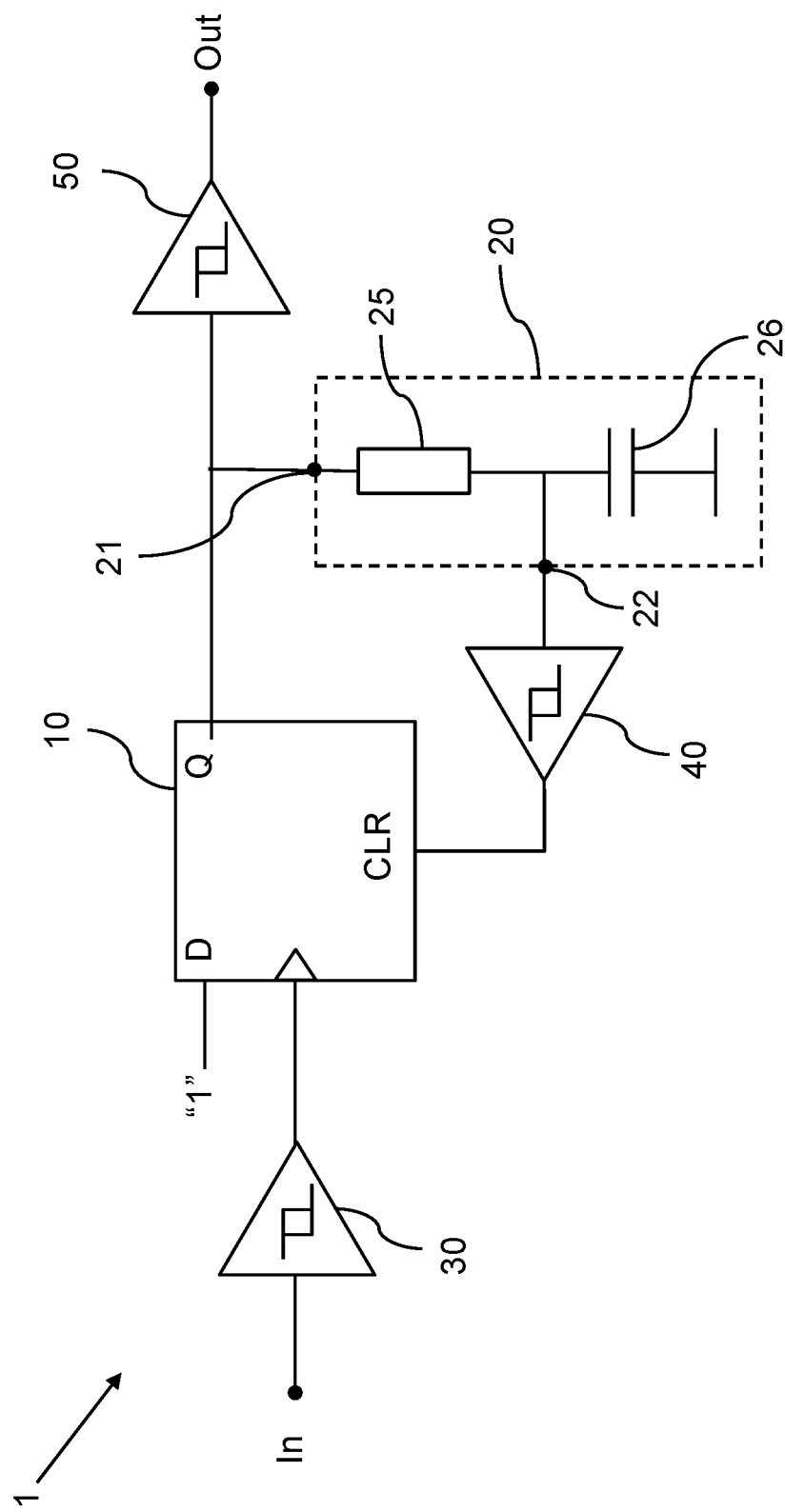
FIG. 5 schematically shows a third embodiment of a pulse shaping circuit according to the invention.

Another embodiment is shown in FIG. 5. This embodiment is essentially similar to the embodiment of FIG. 3 and also comprises a flip-flop 10 and a delay unit 20. In addition, the embodiment of FIG. 5 comprises a first Schmitt trigger 30, a second Schmitt trigger 40 and a third Schmitt trigger 50. The first Schmitt trigger 30 is arranged between the input terminal In and the clock input terminal of the flip-flop 10 and serves to supply well-defined pulses to the clock input terminal. The second Schmitt trigger 40 is arranged between the output terminal 22 of the delay unit 20 and the clear input terminal CLR of the flip-flop 10 and serves to better define the point in time in which the clear input terminal receives a high (logical "1") or a low (logical "0") voltage. The third Schmitt trigger 50 is arranged between the Q output terminal of the flip-flop 10 and the pulse shaping circuit output terminal Out, in particular between the delay unit input terminal 21 and the pulse shaping circuit output terminal Out and primarily serves as a buffer between the pulse shaping circuit and any further circuits, such as a counter circuit.

Although all three Schmitt triggers are optional, the presence of the second Schmitt trigger 40 is particularly advantageous as it better defines the pulse duration and the pulse interval duration. Thus, an embodiment with only the second Schmitt trigger 40 is generally to be preferred over an embodiment without Schmitt triggers, or over an embodiment without the second Schmitt trigger 40 but with either the first Schmitt trigger 30 or the third Schmitt trigger 50.

It is noted that each Schmitt trigger is an example of a component having two defined output states. Such a component preferably comprises a comparator, which compares an input voltage with a reference voltage and outputs one of two possible output voltages. A Schmitt trigger is a particularly advantageous example of a comparator, and is a type of comparator with hysteresis, which prevents its output voltage from changing too quickly with its input signal. However, in the embodiment of FIG. 5 any of the Schmitt triggers could be replaced with a series arrangement of two inverters, for example, or with another type of comparator.

Figure 6:
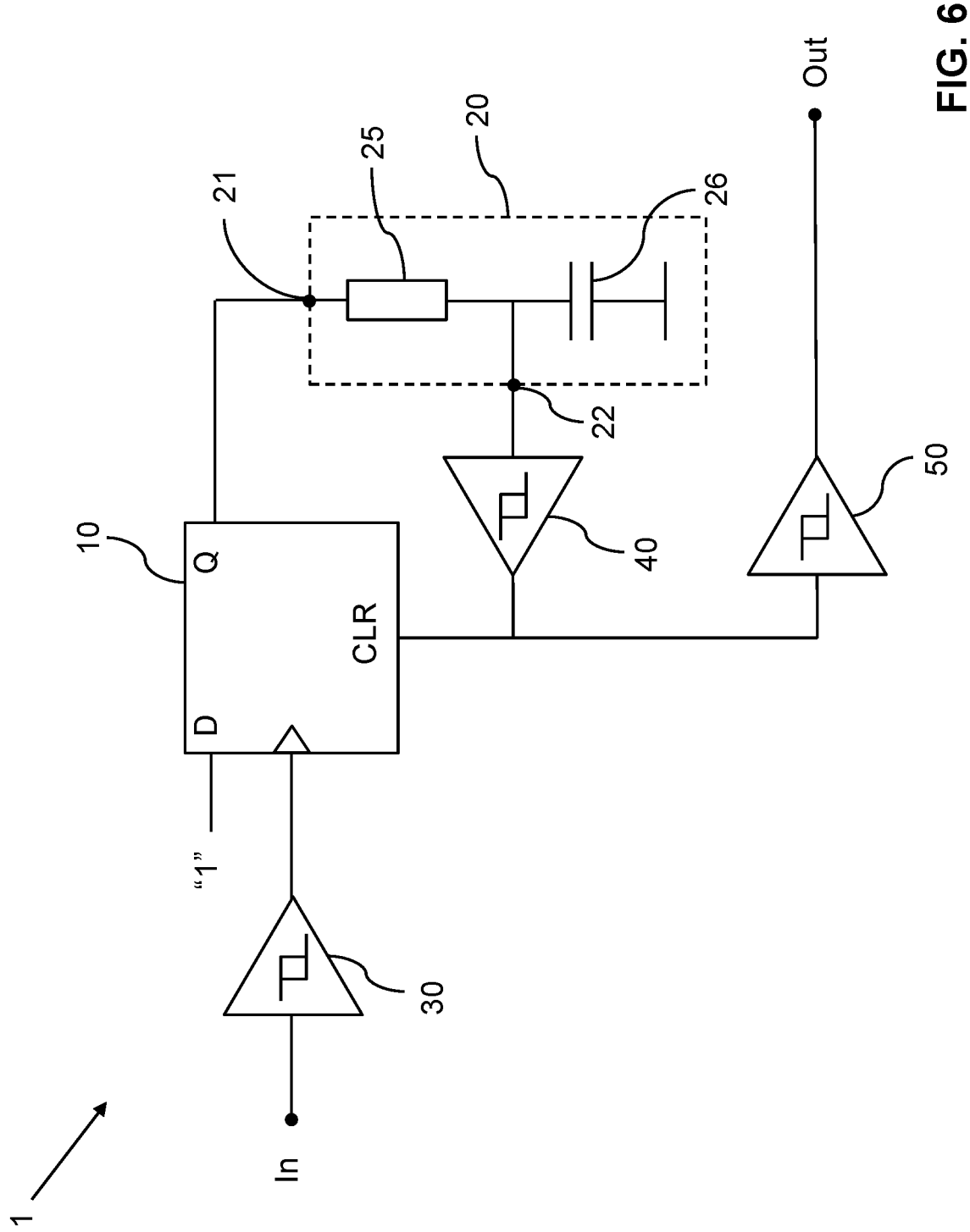
FIG. 6 schematically shows a fourth embodiment of a pulse shaping circuit according to the invention.

The embodiment of FIG. 6 is similar to the embodiment of FIG. 4, but with the addition of three Schmitt triggers 30, 40 & 50. In the signal path between the delay unit 20 and the pulse shaping circuit output terminal Out, the second Schmitt trigger 40 and the third Schmitt trigger 50 are arranged in series. Here, the third Schmitt trigger 50 mainly serves as a buffer between the flip-flop 10 and the output terminal Out and could be replaced with another component having two defined output states.

Figure 7:
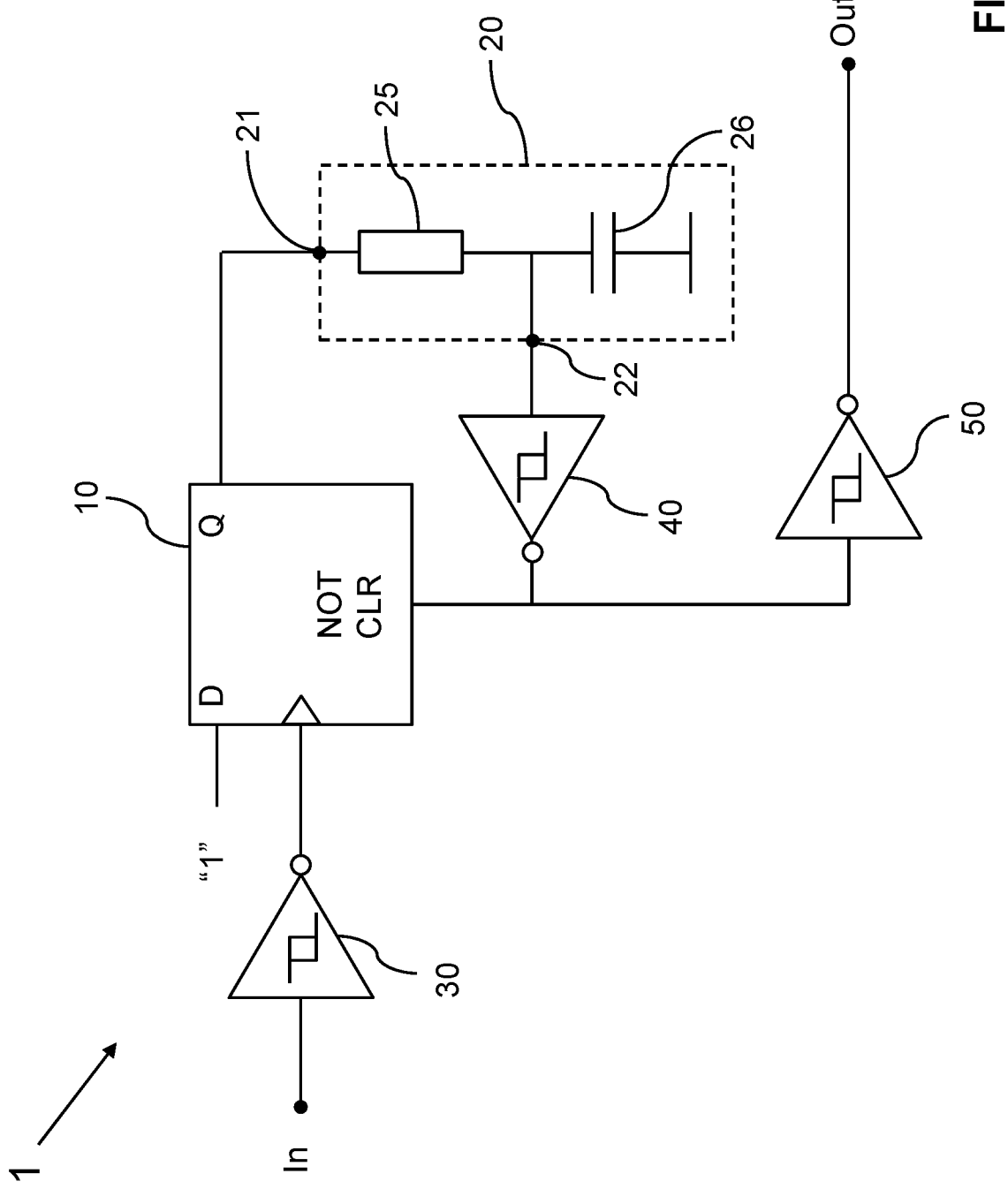
FIG. 7 schematically shows a fifth embodiment of a pulse shaping circuit according to the invention.

The embodiment of FIG. 7 is similar to the embodiment of FIG. 6, with the exception that inverting Schmitt triggers 30, 40 & 50 are used. In this embodiment, the output terminal of the delay unit 20 should be connected, via the second Schmitt trigger 40, to an inverting clear input terminal NOT CLR of the flip-flop 10.

Figure 9:
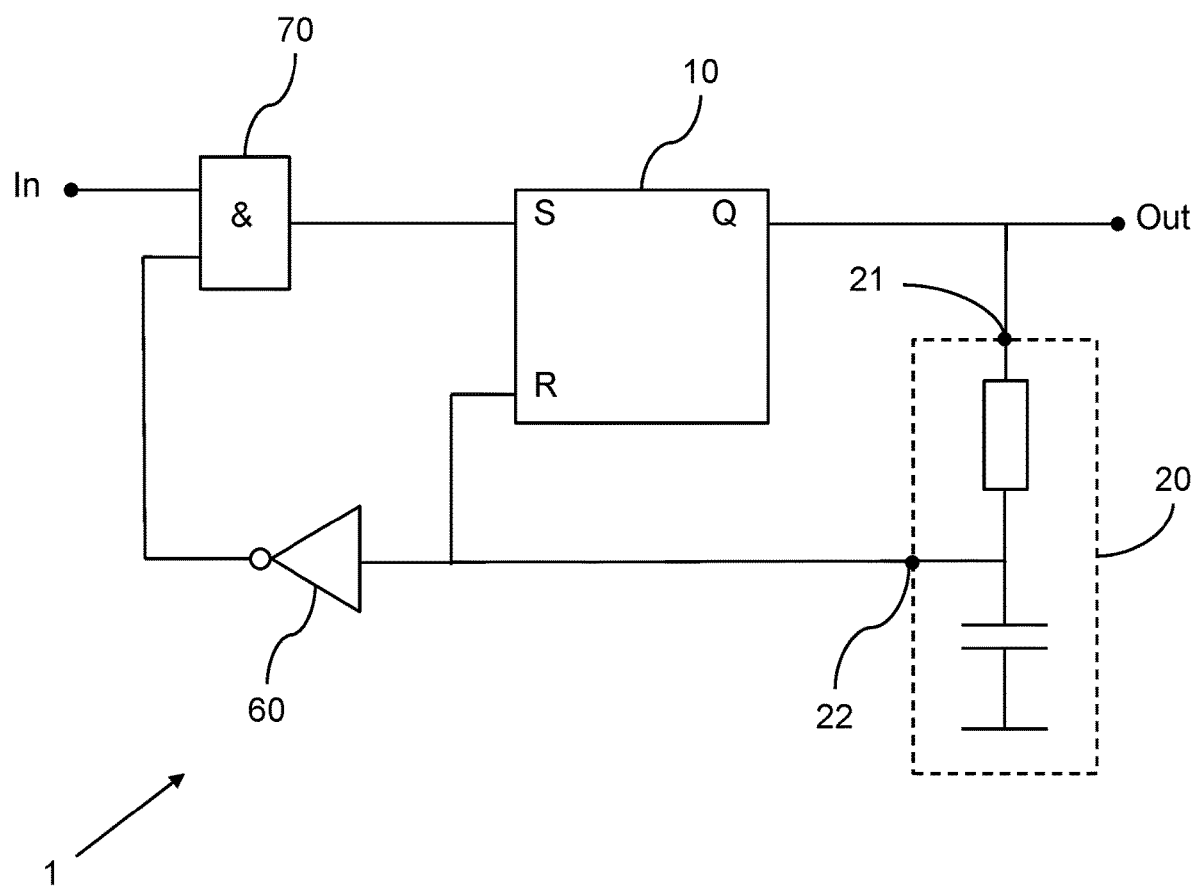
FIG. 9 schematically shows a seventh embodiment of a pulse shaping circuit according to the invention.
Figure 10:
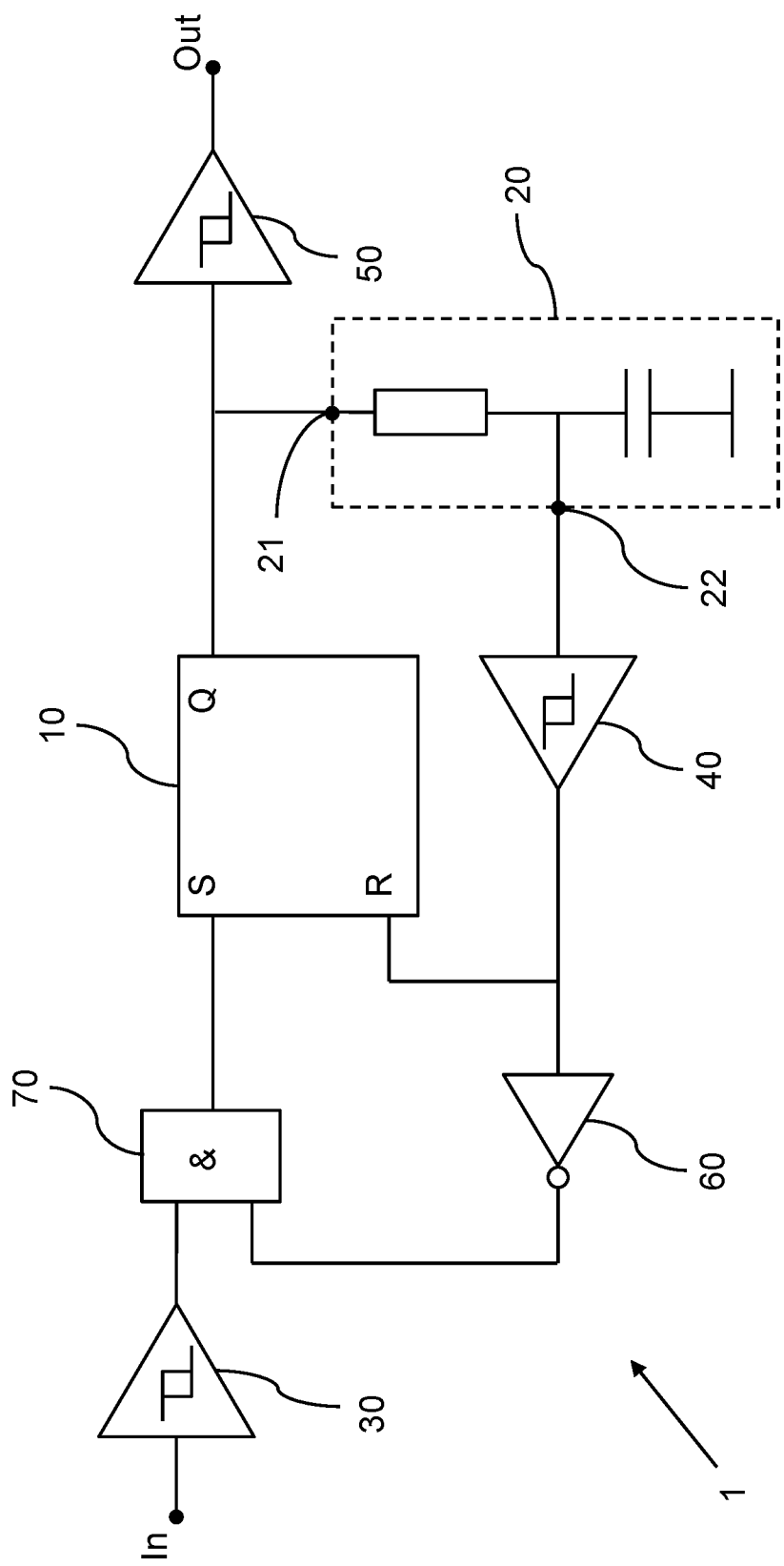
FIG. 10 schematically shows an eighth embodiment of a pulse shaping circuit according to the invention.

In the embodiments described above, D flip-flops are used. The invention is, however, not limited to D flip-flops and may alternatively utilize other flip-flops, such as SR Flip-flops. Embodiments comprising SR flip-flops are schematically shown in FIGS. 8-10.

Figure 8:
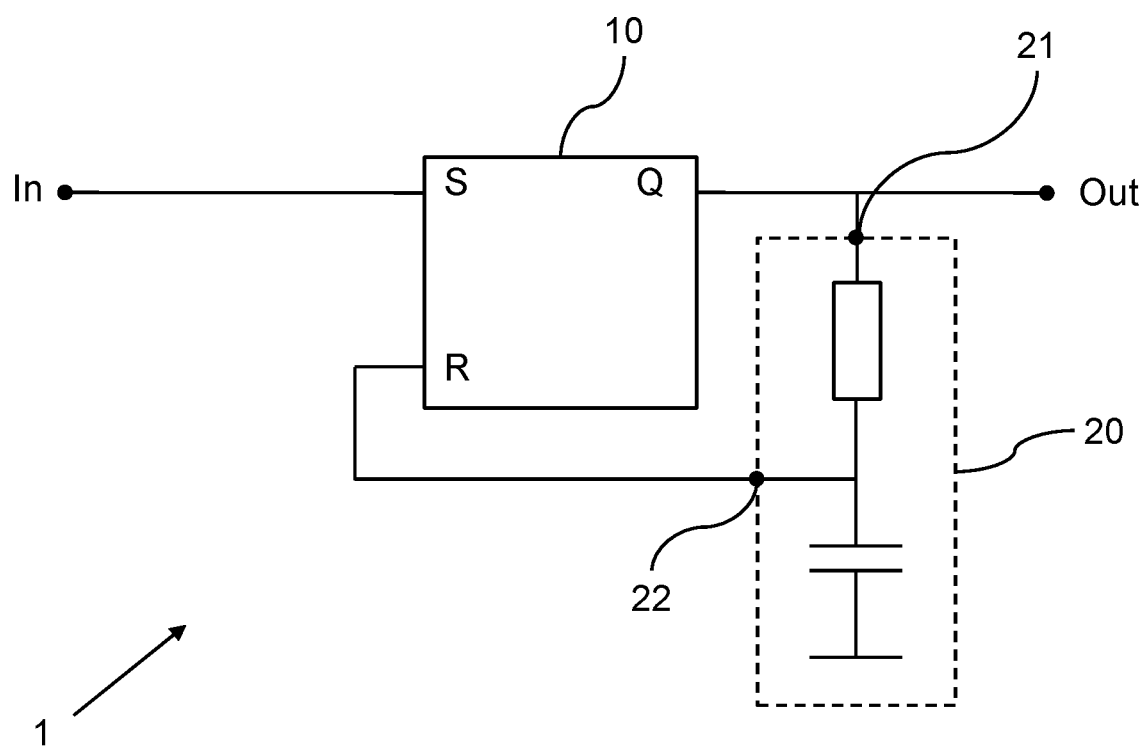
FIG. 8 schematically shows a sixth embodiment of a pulse shaping circuit according to the invention.

The embodiment of FIG. 8 is similar to the one of FIG. 3 and also comprises a flip-flop 10 and a delay unit 20. In the embodiment of FIG. 8, the D flip-flop has been replaced with an SR flip-flop having input terminals S (set) and R (reset) and an output terminal Q. As in FIG. 3, the flip-flop output terminal Q is connected to the pulse shaping output terminal Out and to the delay unit input terminal 21. However, the pulse shaping circuit input terminal In is connected to the first flip-flop input terminal S, while the delay unit output terminal 22 is connected to the second flip-flop input terminal R.

A detector pulse received at the input terminal S will set the flip-flop 10, resulting in a high voltage (logical "1") at the output terminal Q. The pulse shaping circuit 1 will thus produce a pulse at its output terminal Out. As in the embodiment of FIG. 3, this high voltage at the delay unit input terminal 21 will, after a certain delay, produce a high voltage at the delay unit output terminal 22, which is coupled with the R (reset) input terminal of the flip-flop. This will reset the flip-flop, as a result of which the output terminal Q will assume a low voltage. This will trigger another delay in the delay unit 20, after which the voltage at the delay unit output terminal 22 and thus at the R input terminal will become low again, thus ending the reset period. When the reset has ended, the flip-flop is able to respond to the next pulse at its S input terminal.

Although the embodiment of FIG. 8 can function as such, it has the drawback that a situation may occur in which both the S input terminal and the R input terminal carry a high voltage, thus supplying a logical "1" to both the S and the R input terminals, that is, S=R="1". This can cause an undefined state in an SR flip-flop. This situation can be avoided with additional components, as illustrated in FIG. 9. The embodiment of FIG. 9 is identical to the one of FIG. 8, except for the addition of an inverter 60 and an AND gate 70.

The AND gate 70 is arranged between the pulse shaping circuit input terminal In and the S input terminal of the flip-flop 10. The NOR gate 60 is coupled with the delay unit output terminal 22 and therefore receives the reset signal (the delayed output pulse) when it is present. The NOR gate 60 inverts the reset signal and feeds this to the AND gate. Accordingly, if the R input terminal receives a logical "1" (high voltage), then the inverter 60 supplies a logical "0" to the AND gate 70, thus effectively blocking the AND gate, as a result of which no logical "1" can be fed to the S input terminal of the flip-flop. The situation S=R="1" is thus eliminated.

The embodiment of FIG. 10 is similar to that of FIG. 9, with the exception of the addition of three Schmitt triggers 30, 40 and 50. These Schmitt triggers have substantially the same function as their counterparts in FIG. 5, for example. It will be understood that any of the three Schmitt triggers 30, 40 and 50 could be omitted from the embodiment of FIG. 10.

Figure 11:
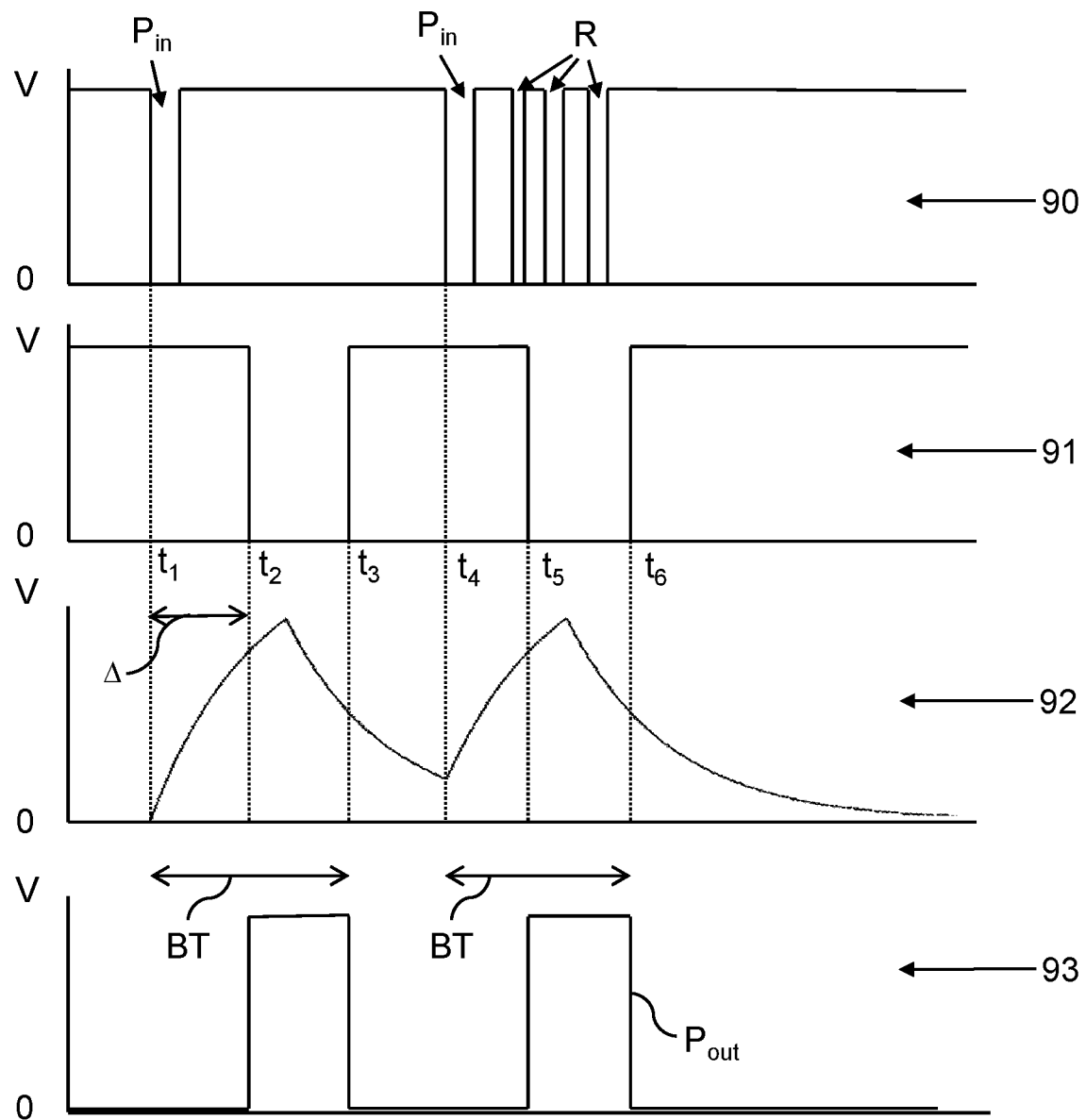
FIG. 11 schematically shows pulses which may occur in embodiments of a pulse shaping circuit according to the invention.

In FIG. 11 various signals which may occur in embodiments of the pulse shaping circuit of the invention are schematically illustrated. The signals illustrated in FIG. 11 are:

Signal 90—the signal at the input terminal of the pulse shaping circuit;

Signal 91—the signal at the (inverting) clear input of the flip-flop;

Signal 92—the signal at the output terminal of the delay unit; and

Signal 93—the signal at the output terminal of the pulse shaping circuit.

The signals illustrated in FIG. 11 may in particular occur in the embodiment shown in FIG. 7.

Detector pulses that may be received by the pulse shaping circuit and that may be output by an amplifier (152 in FIG. 2) are shown at 90. In the particular example shown, the received detector pulses $P_{in}$ are negative relative to the stationary voltage: in the absence of a pulse, a positive voltage V is present at the input of the pulse shaping circuit, while in the presence of a detector pulse $P_{in}$, a zero (or near-zero) voltage 0 is present at the input of the pulse shaping circuit. In the example shown, the flip-flop is a positive edge triggered flip-flop and the pulse shaping circuit has an inverting element at its input, such as the inverting Schmitt trigger 30 in the embodiment of FIG. 7.

As the first (inverted) detector pulse P arrives at the clock input of the flip-flop at time $t_1$, the output Q assumes the value "1", represented by a high voltage, which is supplied to the delay unit. In the embodiment shown in FIG. 7, this causes the capacitor (26 in FIG. 6) to charge, and the voltage at the output terminal (22 in FIG. 7) of the delay unit to rise, as illustrated at 92 in FIG. 11. This output signal of the delay unit is supplied to the clear input of the flip-flop, optionally via a Schmitt trigger (40 in FIG. 7). If this Schmitt trigger is an inverting Schmitt trigger, as in FIG. 7, then an inverting clear input (NOT CLR) of the flip-flop can be used. If this Schmitt trigger is a non-inverting Schmitt trigger, then a regular (non-inverting) clear input (CLR) of the flip-flop can be used.

At time $t_2$, the signal at the output terminal (22 in FIG. 7) of the delay unit reaches a value that causes the flip-flop to clear (that is, reset). That is, the rising voltage at the output terminal of the delay unit, as illustrated at 92, causes the output signal of the inverting Schmitt trigger (40 in FIG. 7) coupled to the output terminal of the delay unit to switch from a high voltage to a low voltage, as illustrated at 91. This low voltage at the output terminal of the delay unit is supplied to the inverting clear input (NOT CLR in FIG. 7) of the flip-flop, causing the flip-flop to clear and the output signal of the flip-flop (at its output terminal Q) to assume a low voltage. It can be seen in FIG. 11 that this clearing (that is, resetting) of the flip-flop happens after a delay $\Delta=(t_2-t_1)$, determined by the delay unit.

Although the particular delay used will vary, depending on the application and the detector used, a typical delay may be in a range from 1 ns to 1 ms, preferably in a range from 1 ns to 1 μs, more preferably in a range from 1 ns to 100 ns, and still more preferably in the range from 10 ns to 50 ns. Those skilled in the art will realize that when a delay unit comprising a series arrangement of a resistor and a capacitor is used, the time constant τ can be approximately equal to the delay $\Delta$, where τ=R.C, with R being the resistance of the resistor and C being the capacitance of the capacitor.

Figure 12:
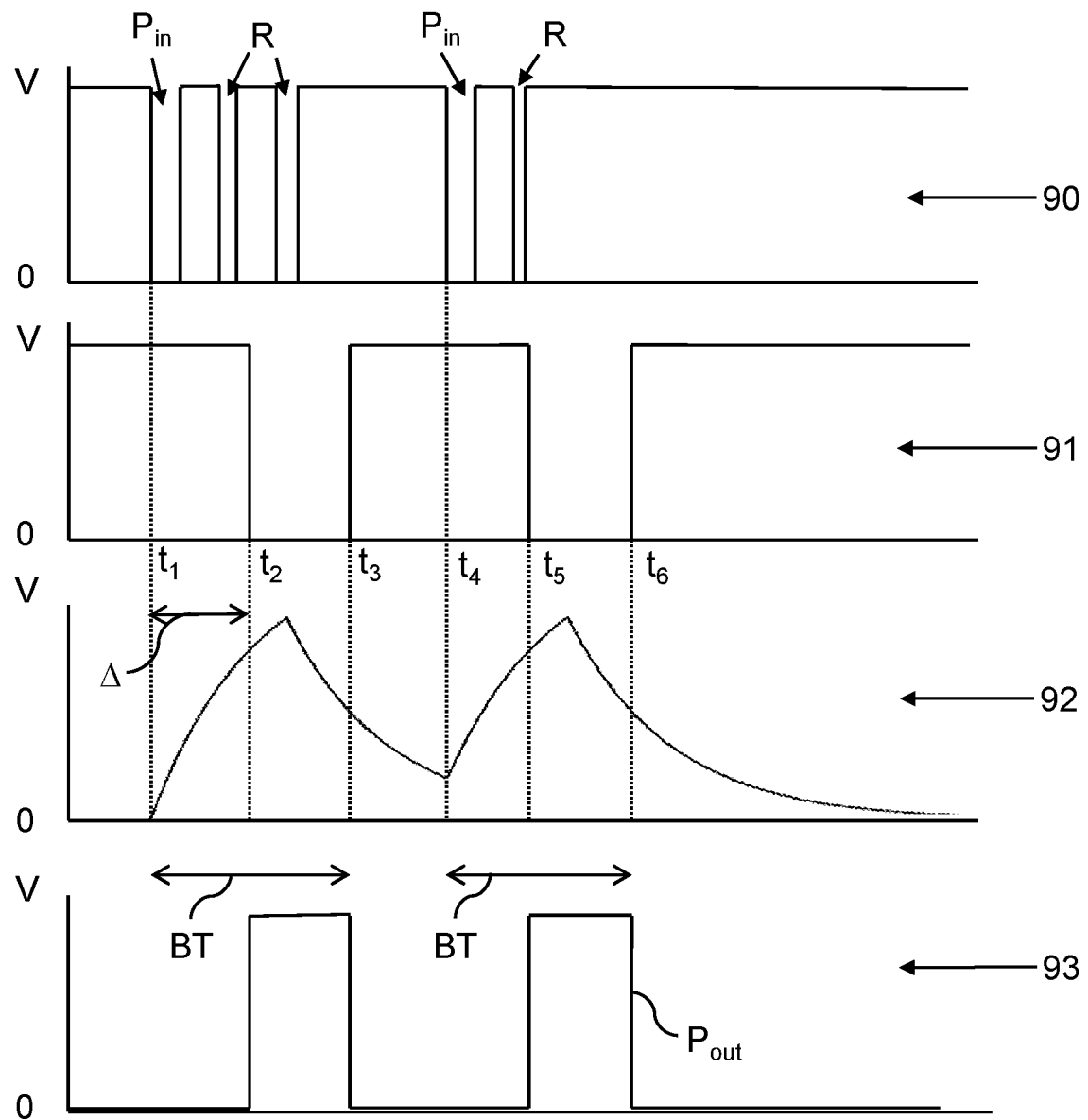
FIG. 12 schematically also shows pulses which may occur in embodiments of a pulse shaping circuit according to the invention.

It is noted that in the example of FIG. 11, as in the example of FIG. 12, any delays caused by the flip-flop or by any Schmitt triggers is neglected for the sake of clarity of the illustration. In practice, each of these elements will cause a delay of a few ns (nanoseconds). The total delay $\Delta$ will therefore be greater than the delay caused by the delay unit and represented by the time constant τ. In a practical embodiment, the total delay $\Delta$ may amount to, for example, approximately 30 ns.

The low voltage at the output terminal Q of the flip-flop due to the reset is fed to the delay unit, which will cause the output signal of the delay unit to decrease, as shown at 92. At time $t_3$, the output signal of the delay unit has reached a low enough voltage for the Schmitt trigger 40 to change its output voltage, thus supplying a high voltage to the inverting clear input of the flip-flop, as illustrated at 91.

In the embodiment of FIG. 7, the output signal of the pulse shaping circuit is substantially an inverted (due to the inverting Schmitt trigger 50 in FIG. 7) version of the signal supplied to the inverting clear input terminal of the flip-flop. The output signal of the pulse shaping circuit is shown at 93 in FIG. 11. It can be seen that the pulse shaping circuit provides clearly defined output pulses $P_{out}$ having a duration defined by the delay unit.

The events described above are repeated at time $t_4$, when the next detector pulse $P_{in}$ is received. According to an important aspect of the invention, the pulse shaping circuit provides a blanking interval BT following the onset of each detector pulse $P_{in}$. Thus, a first blanking interval starts at time $t_1$ and ends at time $t_3$, while a second blanking interval starts at time $t_4$ and ends at time $t_6$. That is, from the time $t_1$ or $t_4$, when a detector pulse $P_{in}$ causes the output terminal Q of the flip-flop to assume a high voltage, the pulse shaping circuit is insensitive to further pulses, such as reflections R. During a first part of the blanking time BT, for example from $t_4$ to $t_5$, the output terminal Q already has a high voltage, corresponding to a logical "1", so further pulses at the clock input terminal of the flip-flop will not change this status. During a second part of the blanking time BT, for example from $t_5$ to $t_6$, the flip-flop is in a "clear" status due to the (inverted) clear signal shown at 91, so the status of the flip-flop cannot be changed.

It can thus be seen that the pulse shaping circuit of the invention provides well-defined output signals that are insensitive to spurious signals, such as reflections and noise signals.

FIG. 12 shows another example of signals which may occur in embodiments of the invention, such as in the embodiment illustrated in FIG. 7. In the example of FIG. 12, two reflections R occur during the first blanking period BT, which extends between time $t_1$ and time $t_3$, while a single reflection R occurs during the second blanking period BT, which extends between time $t_4$ and time $t_6$. As in FIG. 11, the start of the second blanking period is determined by a detector pulse $P_{in}$ being received at time $t_4$. It is noted that $t_4$ may occur at any time after time $t_3$, that is, after the first blanking time BT has ended.

Those skilled in the art will readily be able to add components to or delete components from the embodiments discussed above. For example, other types of flip-flips or latches could be used, such as JK flip-flops, instead of the D flip-flop and SR flip-flop shown. In addition, the delay unit or delay circuit could be arranged differently, using one or more digital elements, such as so-called delay lines, or a series arrangement of gates (e.g. an even number of NOT gates in series).

As mentioned above, embodiments with no, one, two, three or more Schmitt triggers or equivalent components are possible.

It will therefore be understood by those skilled in the art that the invention is not limited to the embodiments described above and that numerous additions and modifications can be made without departing from the scope of the invention as described by the appending claims.

What is claimed is:

1. A pulse shaping circuit for a spectrometer, the circuit comprising:
   a circuit input terminal for receiving detector pulses from an analog ion detector;
   a flip-flop for receiving detector pulses from the circuit input terminal;
   a delay unit for receiving output pulses from the flip-flop and feeding delayed output pulses to a reset input terminal of said flip-flop, such that the duration of the output pulses and the minimum duration of the interval between the output pulses is determined by the delay unit; and
   a circuit output terminal for supplying the output pulses or the delayed output pulses to a counter.

2. The pulse shaping circuit according to claim 1, wherein an output terminal of the delay unit is coupled to the reset input terminal of the flip-flop via a component having two defined output states.

3. The pulse shaping circuit according to claim 2, wherein the component having two defined output states comprises a comparator.

4. The pulse shaping circuit according to claim 3, wherein the comparator comprises a Schmitt trigger.

5. The pulse shaping circuit according to claim 1 or 2, wherein the circuit input terminal is coupled to the flip-flop via a component having two defined output states.

6. The pulse shaping circuit according to claim 5, wherein the component having two defined output states comprises a comparator.

7. The pulse shaping circuit according to claim 6, wherein the comparator comprises a Schmitt trigger.

8. The pulse shaping circuit according to claim 1, wherein an output of the flip-flop is coupled to the circuit output terminal via a component having two defined output states.

9. The pulse shaping circuit according to claim 1, wherein an output of the delay unit is coupled to the circuit output terminal via a component having two defined output states.

10. The pulse shaping circuit according claim 1, wherein the delay unit comprises a resistor and a capacitor.

11. The pulse shaping circuit according to claim 10, wherein the resistor and the capacitor are configured in a series arrangement.

12. The pulse shaping circuit according to claim 1, wherein the flip-flop is a D-flip-flop and wherein the reset input terminal of the flip-flop is a clear terminal.

13. The pulse shaping circuit according to claim 12, wherein a D input terminal of the flip-flop is connected to a logical "1" level.

14. The pulse shaping circuit according to claim 12 or 13, wherein a clock input terminal of the flip-flop is connected to the circuit input terminal.

15. The pulse shaping circuit according to claim 1, wherein the flip-flop is an SR-flip-flop and wherein the reset input terminal of the flip-flop is an R terminal.

16. The pulse shaping circuit according to claim 15, further comprising an AND-gate arranged between the circuit input terminal and the flip-flop, the AND-gate being arranged to receive inverted delayed output pulses of the flip-flop.

17. The pulse shaping circuit according to claim 16, further comprising an inverter arranged between the delay unit and the AND-gate.

18. A detector pulse processing unit, comprising:
   a pulse shaping circuit comprising:
      a circuit input terminal for receiving detector pulses from an analog ion detector;
      a flip-flop for receiving detector pulses from the circuit input terminal;
      a delay unit for receiving output pulses from the flip-flop and feeding delayed output pulses to a reset input terminal of said flip-flop, such that the duration of the output pulses and the minimum duration of the interval between the output pulses is determined by the delay unit; and
      a circuit output terminal for supplying the output pulses or the delayed output pulses to a counter; and
   a counter for counting shaped detector pulses received from the pulse shaping circuit.

19. A detector pulse processing unit as recited in claim 18, further comprising:
- an amplifier that is configured to receive signal pulses from a detector unit and to provide amplified signal pulses to the pulse shaping circuit.

20. A mass spectrometer comprising:
- an ion source;
- a mass filter configured to receive ions from the ion source;
- a detector unit for detecting ions transmitted through the mass filter; and
- a detector pulse processing unit configured to receive signal pulses or amplified signal pulses generated by the detector unit, comprising:
  - a pulse shaping circuit comprising:
    - a circuit input terminal for receiving detector pulses from an analog ion detector;
    - a flip-flop for receiving detector pulses from the circuit input terminal;
    - a delay unit for receiving output pulses from the flip-flop and feeding delayed output pulses to a reset input terminal of said flip-flop, such that the duration of the output pulses and the minimum duration of the interval between the output pulses is determined by the delay unit; and
    - a circuit output terminal for supplying the output pulses or the delayed output pulses to a counter; and
  - a counter for counting shaped detector pulses received from the pulse shaping circuit.

\* \* \* \* \*

UNITED STATES PATENT AND TRADEMARK OFFICE
CERTIFICATE OF CORRECTION

PATENT NO. : 11,694,885 B2
APPLICATION NO. : 17/483410
DATED : July 4, 2023
INVENTOR(S) : Eike Jasper et al.

It is certified that error appears in the above-identified patent and that said Letters Patent is hereby corrected as shown below:

In the Claims

In Column 12, Claim 5, Line 12, delete "claim 1 or 2," and insert -- claim 1, --, therefor.
In Column 12, Claim 10, Line 27, delete "according claim" and insert -- according to claim --, therefor.
In Column 12, Claim 14, Line 38, delete "claim 12 or 13," and insert -- claim 12, --, therefor.

Signed and Sealed this
Twenty-ninth Day of August, 2023

Katherine Kelly Vidal
*Director of the United States Patent and Trademark Office*